April 4, 1961 D. G. CANADA 2,978,651

VERNIER TUNING CIRCUIT FOR HIGH FREQUENCY TUNER

Filed Dec. 30, 1957

INVENTOR.
DAVID G. CANADA
BY
Mason, Kolehmainen, Rathburn and Wyss
ATTORNEYS.

United States Patent Office 2,978,651

Patented Apr. 4, 1961

2,978,651

VERNIER TUNING CIRCUIT FOR HIGH FREQUENCY TUNER

David G. Canada, Bedford, Ind., assignor to Sarkes Tarzian, Inc., Bloomington, Ind., a corporation of Indiana Filed Dec. 30, 1957, Ser. No. 705,856

5 Claims. (Cl. 331—170)

The present invention relates to tuners and more particularly to the oscillator section of high frequency tuners employed in television receivers.

Television tuners which are presently available on the market generally comprise a channel selector control and a vernier tuning control. The channel selector control is used to switch preselected impedance elements into the various resonant circuits of the tuner to adjust the resonant frequencies of such circuits to approximately the desired value for optimum reception of the signals on the respective channels. Necessarily, this tuning adjustment is relatively coarse and although it is satisfactory for most of the resonant circuits in the tuner, a more accurate control of the local oscillator frequency is required for efficient operation of the IF channel of the associated television receiver. Accordingly, the vernier tuning control is used to provide a fine tuning adjustment of the local oscillator.

While the vernier tuning requirements will vary with the design of the associated oscillator, a vernier tuning range of approximately three megacycles is usually required. Moreover, it is important that the vernier tuning range be not much greater than three megacycles to insure that the oscillator frequency can be accurately adjusted and to prevent tuning in of an adjacent channel by means of the vernier tuning control. For purposes of economy and ease of tuning, it is desirable to employ a single variable impedance for enabling vernier tuning of the oscillator at all frequencies, and ordinarily this impedance comprises a trimmer capacitor connected across all or a portion of the tuned circuit of the oscillator. If the trimmer capacitor were connected across the entire tuned circuit, its affect on the oscillator frequency would be much greater at channel 13 than at channel 2 and, therefore, the vernier tuning range at channel 13 would be of the order of four times the range at channel 2.

In order to greatly improve the consistency of vernier bandwidth between the high and low ends of the entire VHF television band, where the local oscillator is of the ultra-audion type with an RF grounded cathode, the trimmer capacitor has been selected to provide the desired vernier tuning range for channel 2 and has been connected between ground and a tap on the oscillator tuned circuit inductance which is closely disposed with respect to the virtual ground point for channel 13. Consequently, at channel 2 the trimmer capacitor is connected across substantially the entire oscillator tuned circuit while at channel 13 it is connected across but a small predetermined portion of the tuned circuit inductance. Proper selection of the displacement between the virtual ground for channel 13 and the tap to which the trimmer capacitor is connected enables the provision of an equal vernier tuning range for channels 2 and 13. However, as the oscillator is tuned away from channel 13 in the high portion of the VHF television band, the virtual ground point moves away from the tap to which the trimmer capacitor is connected and the vernier tuning range increases. At channel 7 the vernier tuning range is at a maximum and accuracy of tuning is impaired.

Therefore, a principal object of the present invention is to provide a new and improved television tuner having a uniform vernier tuning range for all tunable channels.

Another object of the present invention is to provide a new and improved vernier tuning circuit for a high frequency tuner.

A further object of the present invention is to provide a new and improved trimmer capacitor.

Briefly, the above and further objects are realized in accordance with the present invention by providing an ultra-audion oscillator employing a pair of ganged trimmer capacitances connected between ground and different tapped-down points on the oscillator tuned circuit inductance. One of the capacitances is connected to a point in proximity to the virtual ground point of the tuned circuit inductance when the oscillator is tuned to the highest frequency and the other capacitance is connected to the virtual ground point of the inductance when the oscillator is tuned to that frequency at which a maximum vernier tuning would be provided if only the first trimmer capacitance were employed. In a VHF television tuner, the second capacitance is connected to the virtual ground point for channel 7.

In accordance with another aspect of the present invention, the two capacitances are provided in a single device which includes two stators respectively connected to the appropriate points on the oscillator tuned circuit inductance and a rotor connected to ground. By constructing a single unit to provide both capacitance values, the cost of the vernier tuning control employing the two capacitance values is substantially the same as that of the vernier tuning control employing a single trimmer capacitor of the prior art type including but one of the capacitance values.

The invention, both as to its organization and method of operation, together with further objects and advantages thereof, will best be understood by reference to the following specification, taken in connection with the accompanying drawings, in which.

Figures 1, 2, 3:
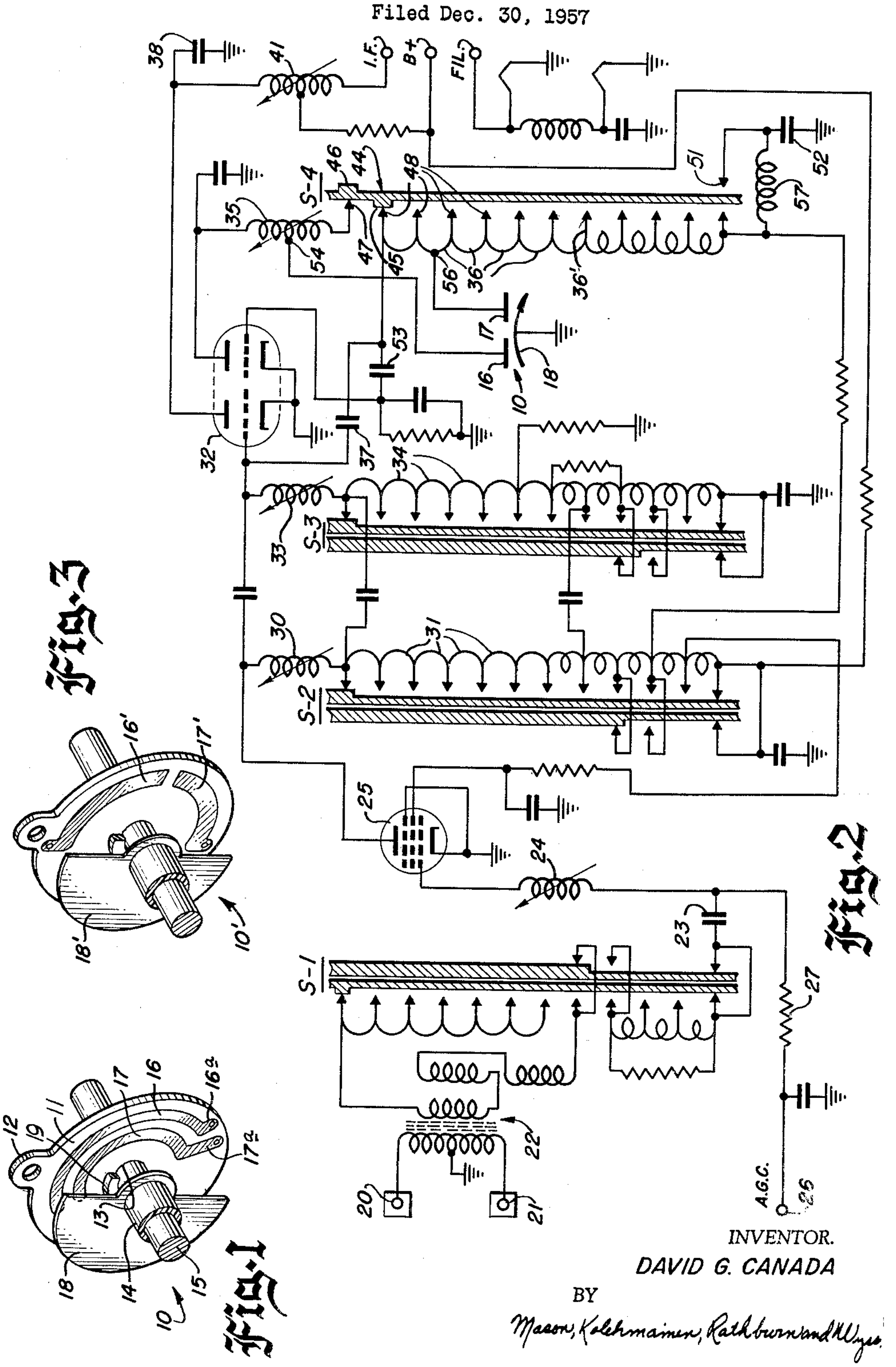
Fig. 1 is a perspective view of a trimmer capacitor embodying the present invention.
Fig. 2 is a schematic circuit diagram of a tuner employing the RF oscillator arrangement of the present invention.
Fig. 3 is a perspective view of another trimmer capacitor embodying the present invention.

Referring now to the dawing, and particularly to Fig. 1 thereof, there is shown a trimmer capacitor 10 comprising an insulating supporting wafer 11 having an apertured mounting ear 12 extending from the periphery thereof and having a centrally disposed aperture 13 through which may extend a vernier tuning shaft 14 which is concentrically disposed outside of a main channel selector shaft 15. A first stator plate 16 is mounted on the surface of the disc 11 and a second stator plate 17 is also mounted on the surface of the insulator 11 in spaced apart relationship from the stator 16. As shown, the stators 16 and 17 are arcuate and are concentrically disposed with respect to the principal axis of the vernier tuning shaft 14, the stators 16 and 17 preferably include radially directed end portions 16$a$ and 17$a$ which provide terminals for facilitating connection of the stators 16 and 17 to the associated electric circuit. The rotor of the trimmer capacitor 10 comprises a semicircular conductive plate 18 which is mounted on the vernier tuning shaft 14 in spaced apart relationship from the adjacent faces of the stator plates 16 and 17 by means of a spacer 19. Consequently, as the vernier tuning shaft 14 is rotated to increase the overlapping areas between the rotor plate 18 and the stator plates 16 and 17, the capacitance values between the stator plate 16 and the rotor 18 and between the stator plate 17 and the rotor 18 respectively increase.

Referring now to Fig. 2 wherein is shown a schematic circuit diagram of a television tuner which may employ the trimmer capacitor 10 for providing vernier tuning adjustment of the local oscillator. This circuit comprises a plurality of switch wafers respectively designated S–1, S–2, S–3, and S–4 shown in developed form to simplify the illustration of the circuit connections thereto, each of these switch wafers being shown with the rotor thereof in the channel 13 position, i.e., the highest frequency channel which may be selected by the tuner. The television signals which are received by an antenna system connected to a pair of antenna terminals 21 and 20 are coupled through an antenna input transformer 22, through the switch wafer S–1 and through a coupling capacitor 23 and a tuning coil 24 to the control grid of an RF amplifier tube 25. An AGC voltage from the second detector portion of the television receiver is impressed upon an AGC terminal 26 and is supplied through a resistor 27 and the coil 24 to the control grid of the tube 25. The plate circuit of the tube 25 is tuned by means of a coil 30 and a plurality of incremental inductances 31 which may be selectively connected in circuit by means of the switch wafer S–2. The anode of the tube 25 is capacitance coupled to the control grid of the left-hand section of a mixer-oscillator tube 32, this left-hand section of the tube 32 acting as a mixer, the input circuit of which is tuned by means of a variable inductance 33 and the selected ones of a plurality of incremental inductances 34 which are selectively connected in the mixer input circuit by means of the switch wafer S–3. The right-hand section of the tube 32 is employed as the local oscillator of the tuner and the plate circuit of this section of the tube includes a variable inductance 35 to which a plurality of incremental inductances 36 may be selectively added by means of the switch wafer S–4. The output of the local oscillator section of the tube 32 is coupled through a condenser 37 to the control grid of the mixer section of the tube 32, and the plate circuit of the left-hand section of the tube 32 is tuned by means of a capacitor 38 and a variable inductance 41 to the desired intermediate frequency.

The switch wafer S–4 includes a short-circuiting bar 44 having an offset portion 45 on the left-hand or forward side thereof and an offset portion 46 on the right-hand or back side portion thereof. The variable inductance 35 is, as shown, directly connected between the plate of the oscillator section of the tube 32 and a contact 47 which is always in engagement with the shorting bar 44. The offset portion 45 is selectively engageable with each of a plurality of contacts 48 between which the incremental inductances 36 are connected, and the offset portion 46 is adapted to be selectively connected to a contact 51 which is connected to ground through a capacitor 52. With the switch S–4 in the position shown, the inductance 35 is serially connected with a blocking capacitor 53 between the plate and control grid of the oscillator section of the tube 32. Since the inductance 35 is the total inductance in the tuned plate circuit of the oscillator which is of the ultra-audion type, some point along the inductance 35 is at virtual ground potential. Accordingly, the stator plate 16 of the trimmer capacitor 10 is connected to a tap point 54 which is displaced a predetermined distance from the virtual ground point on the inductance 35 with the switch wafer S–4 in the illustrated position. As the shorting bar 44 is moved downwardly, as shown in Fig. 2, so that the offset portion 45 engages the next lower one of the contacts 48, an incremental inductance is added in series with the variable inductance 35 between the plate and grid of the oscillator tube section. When the switch wafer S–4 has been so adjusted that the offset portion 45 is in engagement with the switch contact designated 36', it will be apparent that the oscillator is tuned for reception of channel 7. With the oscillator tuned circuit thus including all of the incremental inductances shown above the contact 36', the virtual ground point in this tuned circuit will ordinarily be on the incremental inductance coil which is added to the tuned circuit when the oscillator is tuned from channel 12 to channel 11. Accordingly, the stator plate 17 is connected to a tap 56 on this incremental inductance, the tap 56 being at virtual ground when the oscillator is tuned for reception of channel 7. It will be apparent that variation in the value of the capacitance between the stator 17 and the rotor 18 when the oscillator is tuned for optimum reception of channel 7 will have no affect on the oscillator frequency but that the capacitance between the stator 16 and the rotor 18 will have a substantial effect since this portion of the trimmer is connected between ground and a point substantially displaced from the virtual ground point of the tuned circuit. With the offset portion 45 in engagement with the lowermost one of the contact brushes 36, the oscillator is tuned for optimum reception by the tuner of channel 3. Movement of the shorting bar 44 downwardly to the next position causes the offset portion 46 thereof to engage the back contact 51 thereby to add an incremental inductance unit 57 in series with the incremental inductances 36 and the variable inductance 35 between the plate and grid of the oscillator section of the tube 32. The dimensions of the rotor 18 and of the stators 16 and 17 are so chosen that with the wafer S–4 in the channel 2 position the optimum vernier tuning range is provided. Moreover, the displacement between the virtual ground point for channel 13 and the tap 54 is selected so that with this predetermined trimmer capacitor 10, substantially the same vernier tuning range is provided at channel 13 as is provided at channel 2. With this arrangement, as the wafer S–4 is moved to change the selected channel from channel 13 to channel 7, a very slight increase in vernier tuning range may be noticed as the tuner is tuned from channel 13 to channel 7, and a small reduction in the vernier tuning range may occur as the tuner is tuned from channel 6 to channel 2. This change is, however, very slight and is a substantial improvement over the prior art vernier tuning arrangement wherein a single trimmer capacitor was connected between ground and a tapped-down point slightly displaced from the channel 13 virtual ground position.

Although the trimmer capacitor 10, as shown in Fig. 1, employs a pair of stator plates 16 and 17 which are partially concentric and substantially uniform throughout their respectivce lengths, variations in the surface areas of these stator plates throughout their length may be employed to improve the uniformity of vernier tuning range throughout the frequency range of the oscillator.

Referring to Fig. 3, there is shown a trimmer capacitor 10' which includes a set of stator plates 16' and 17' and a rotor plate 18'. The plates 16' and 17' have different configurations than the stator plates in the trimmer capacitor 10 but otherwise the capacitors 10 and 10' are identical. The stator plates 16' and 17' are arcuate and are disposed in spaced apart end-to-end relationship. Consequently, as the rotor 18' is rotated clockwise from the position shown in Fig. 3 the capacitance value between the rotor 18' and the stator 16' is increased but only a negligible change is effected in the capacitance value between the rotor 18' and the stator 17'. However, it will be apparent to those skilled in the art that since the stator plates 16' and 17' occupy but 180° of the angle of rotation of the semicircular rotor plate 18' that both capacitance values may be simultaneously adjusted to a maximum.

While a particular embodiment of the invention has been shown, it will be understood, of course, that it is not desired that the invention be limited thereto since modification may be made, and it is, therefore, contemplated by the appended claims to cover any such modifications as fall within the true spirit and scope of the invention.

Having thus described the invention, what is claimed as new and desired to be secured by Letters Patent is:

1. In a tuner, an ultra-audion oscillator including a discharge device having an anode, a cathode and a control electrode, means for connecting said cathode to a point of fixed potential, resonant circuit means including an inductance connected between said anode and said control electrode, main tuning means for adjusting the value of said inductance to tune said oscillator throughout a relatively wide range, and vernier tuning means independent of said main tuning means and connected in circuit relationship with said inductance for tuning said oscillator throughout a relatively narrow range, said vernier tuning means comprising a first variable capacitance connected between said point of fixed potential and a tap on said inductance having a potential approximating that of said fixed potential when said oscillator is tuned near the high end of its tuning range, and said vernier tuning means comprising a second variable capacitance connected between said point of fixed potential and a tap on said inductance having a potential approximately that of said fixed potential when said oscillator is tuned to an intermediate frequency in its tuning range.

2. An oscillator as set forth in claim 1 wherein said point of fixed potential is ground and said first and second capacitors are controlled by a single vernier tuning shaft.

3. In a television tuner, a local oscillator comprising an amplifier, an input circuit for said amplifier, an output circuit for said amplifier, a tuned circuit connected in one of said circuits, said tuned circuit comprising a plurality of incremental inductances and switching means for selectively connecting said inductances into effective circuit relationship with said amplifier, said tuned circuit having a first tap which is at virtual ground potential at a frequency near the upper end of the acceptance band of the tuner and a second tap which is at virtual ground potential at an intermediate frequency in the acceptance band of the tuner, a first variable capacitance connected between a point of fixed potential and said first tap, a second variable capacitance connected between a point of fixed potential and said second tap, and control means for simultaneously adjusting the value of said capacitances to provide vernier tuning of said oscillator.

4. An oscillator as set forth in claim 3 wherein said point of fixed potential is ground and said predetermined amount is selected so that said control means has a substantially equal vernier tuning range at both ends of the television band accepted by the television tuner.

5. A local oscillator as set forth in claim 3 wherein said first and second capacitances comprise a plurality of stator plates and a common rotor plate.

References Cited in the file of this patent

UNITED STATES PATENTS

| | | |
|---|---|---|
| 1,918,238 | Andrews | July 18, 1933 |
| 2,145,371 | Reid | Jan. 31, 1939 |
| 2,150,562 | Reid | Mar. 14, 1939 |
| 2,159,105 | Reid | May 23, 1939 |
| 2,169,257 | Krebs et al. | Aug. 15, 1939 |
| 2,244,023 | Sauer | June 3, 1941 |
| 2,551,228 | Achenbach | May 1, 1951 |
| 2,591,705 | Kodama | Apr. 8, 1952 |
| 2,620,378 | Thias | Dec. 2, 1952 |